United States Patent
Cuevas

(10) Patent No.: US 6,798,228 B2
(45) Date of Patent: Sep. 28, 2004

(54) TEST SOCKET FOR PACKAGED SEMICONDUCTOR DEVICES

(75) Inventor: Peter Cuevas, Los Gatos, CA (US)

(73) Assignee: QualiTau, Inc., Santa Clara, CA (US)

( * ) Notice: Subject to any disclaimer, the term of this patent is extended or adjusted under 35 U.S.C. 154(b) by 15 days.

(21) Appl. No.: 10/340,102

(22) Filed: Jan. 10, 2003

(65) Prior Publication Data

US 2004/0135592 A1 Jul. 15, 2004

(51) Int. Cl.$^7$ .................. G01R 31/02; H01R 12/00
(52) U.S. Cl. .................. 324/755; 324/761; 324/754; 439/66; 439/70
(58) Field of Search .................. 324/754–761, 324/765, 158.1; 439/59–66, 70; 361/624

(56) References Cited

U.S. PATENT DOCUMENTS

| | | | | |
|---|---|---|---|---|
| 4,326,765 A | * | 4/1982 | Brancaleone | 439/69 |
| 5,038,467 A | * | 8/1991 | Murphy | 29/845 |
| 5,199,889 A | * | 4/1993 | McDevitt, Jr. | 439/66 |
| 5,519,331 A | * | 5/1996 | Cowart et al. | 324/755 |
| 5,534,787 A | * | 7/1996 | Levy | 324/761 |
| 6,208,155 B1 | * | 3/2001 | Barabi et al. | 324/754 |
| 6,278,283 B1 | * | 8/2001 | Tsugai | 324/678 |
| 6,667,628 B2 | * | 12/2003 | Ahrikencheikh et al. | 324/754 |

* cited by examiner

Primary Examiner—Kamand Cuneo
Assistant Examiner—Paresh Patel
(74) Attorney, Agent, or Firm—Beyer Weaver & Thomas LLP

(57) ABSTRACT

A test socket assembly for use in testing integrated circuits includes a spring holder plate having a plurality of holes for receiving a plurality of electrically conducting springs, and a plurality of electrically conducting springs in the plurality of holes. A test socket including a plurality of pins for receiving leads of an integrated circuit is mounted on the spring holder plate with the pins extending into the plurality of holes in the spring holder plate with each pin engaging a spring. The holder plate is positionable on a printed circuit board with the plurality of holes in the spring holder plate being in alignment with electrical contacts or pads on the printed circuit board, the plurality of springs electrically interconnecting the contacts and the plurality of pins.

8 Claims, 3 Drawing Sheets

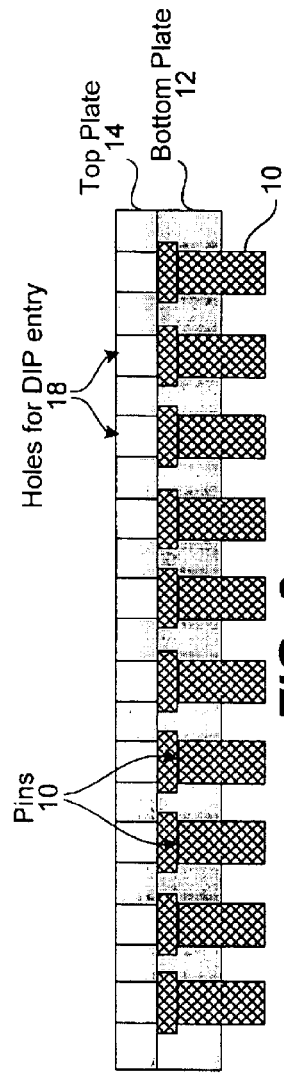
FIG. 2 *Prior Art*
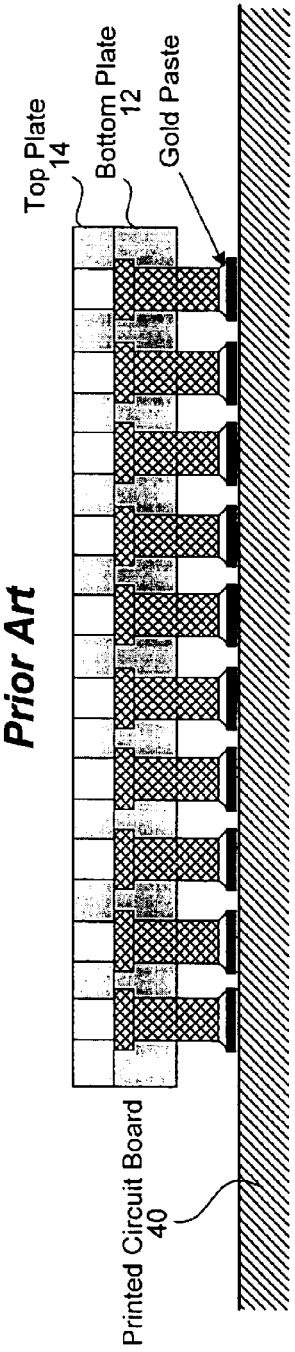
FIG. 3 *Prior Art*
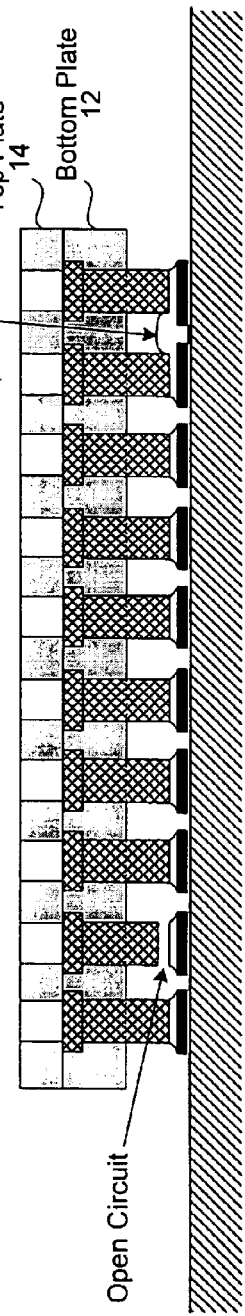
FIG. 4 *Prior Art*

TEST SOCKET FOR PACKAGED SEMICONDUCTOR DEVICES

BACKGROUND OF THE INVENTION

This invention relates generally to sockets for receiving packaged integrated circuits for test purposes, and more particularly the invention relates to a test socket for a dual in-line semiconductor package, or DIP.

In the manufacture of integrated semiconductor circuits (ICs), the final packaged IC must be subjected to testing. Sockets must be provided for receiving and protecting leads of the IC during the test. Typically a plurality of test sockets are mounted on a printed circuit board (PCB) with a PCB providing interconnections between the ICs and test equipment.

A conventional test socket is shown in an exploded perspective view in FIG. 1. Pins 10 having holes for receiving the IC leads are housed between a lower plate 12 and an upper plate 14. The diameter of each pin 10 is smaller at the bottom for reception in a hole 16 through bottom plate 12 with a flange on the upper end of each pin 10 being received in a recessed larger portion of each hole. Once the pins are assembled in bottom plate 12, top plate 14 is assembled to bottom plate 12 by suitable fasteners such as screws (not shown) to retain the pins in the bottom plate. Top plate 14 has holes 18 extending therethrough in alignment with pins 10 and which receive leads of an IC package. However, holes 18 are smaller in diameter than the flanges of pins 10 whereby the pins are captured between the upper and lower plates. FIG. 2 is a side view in section of the assembled socket taken along a row of pins.

In assembling the test sockets on a PCB, the pins of the socket are aligned with conductive pads on the PCB. It is essential that the connection between the socket pins and the pads that serve as a mounting point to the conductive traces on the PCB be of high quality. To this end, prior art sockets use gold paste to attach the socket pins to the PCB pads. The sockets are mounted to the PCB using screws after a small amount of gold paste is applied between the pins and the pads, and the assembly is then cured at a certain high temperature to achieve a good bond between the pins and the pads. The completed structure as shown in section view in FIG. 3.

Unfortunately, there are several problems with this structure and process. One problem is due to a certain degree of variation in the height of the pins that is a result of the imperfect nature of any pin manufacturing process. If a pin is short enough, then the gold paste will not be able to fill the gap between the pin and the underlying pad, thus creating an open circuit. Further, if too much gold paste is applied between pins and pads, the gold paste may overrun into an adjacent pin/pad, thereby creating an undesired short circuit. These problems are illustrated in the section view of FIG. 4. Exacerbating the situation is the fact that the gold paste method is an irreversible process, there is no simple process to return the gold paste back to original liquid state once securing is complete. Thus, if an open or short circuit problem is discovered, it is very difficult to make repairs to the affected sites.

The present invention overcomes these problems with prior art test sockets.

BRIEF SUMMARY OF THE INVENTION

In accordance with the invention, electrically conductive springs are used to make electrical contact between connector pins of a test socket and contact pads on a PCB on which the socket is mounted. Accordingly, the springs can compensate for different lengths of connector pins.

In a preferred embodiment, a spring holder plate is positioned on a PCB with the holder plate having holes in alignment with contact pads on the PCB, the holes having a diameter for accepting springs whose diameters are less than the diameters of the contact pads.

Springs made of high temperature spring wire are placed in the holes in the holder plate, and then the test socket is mounted on the holder plate with socket pins aligned with and engaging the springs. The socket can comprise a bottom plate and a top plate, similar to the prior art. Screws or other fasteners then attach the socket to the holder plate or PCB or both.

The length of the springs compensates for differences in lengths of the socket contacts. The holes in the holder plate prevent the springs from contacting each other and shorting. Furthermore, if there are any defective springs or contacts in the assembly, the structure can be readily disassembled for repairs.

The invention and objects and features thereof will be more readily apparent from the following detailed description and appended claims when taken with the drawings.

BRIEF DESCRIPTION OF THE DRAWINGS

FIG. 2 is a side view in section of the test socket of FIG. 1.

FIG. 3 is a side view in section of the test socket of FIG. 1 assembled on a printed circuit board.

FIG. 4 is a side view in section of the test socket and printed circuit board shown in FIG. 3 and illustrating potential problems.

DETAILED DESCRIPTION OF THE ILLUSTRATIVE EMBODIMENTS

Figure 5:
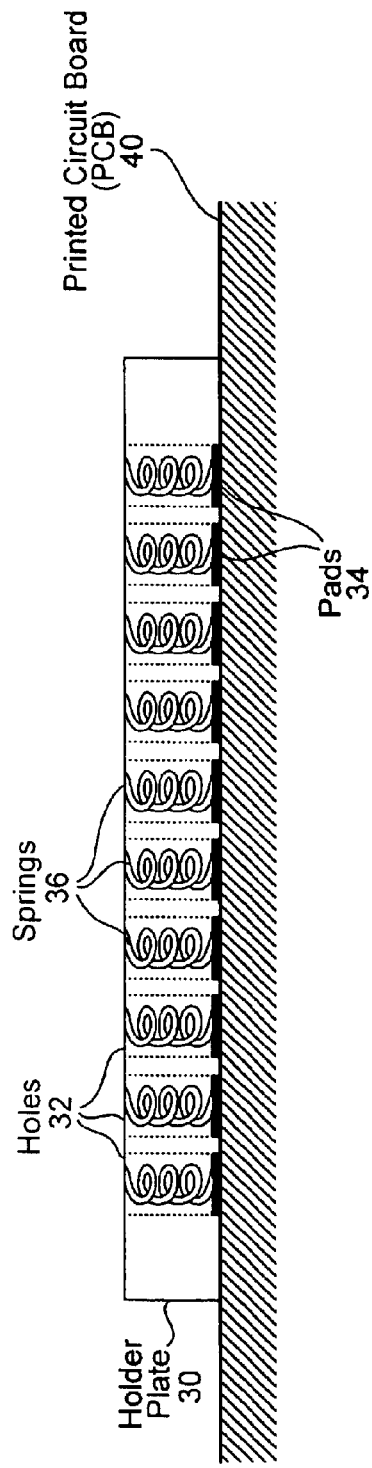
FIG. 5 is a side view in section of a spring holder plate assembled on a printed circuit board with springs in the holder plate contacting pads on the PCB in accordance with one embodiment of the invention.

Referring now to FIG. 5, a holder plate 30 is positioned on a PCB 40 with holder plate 30 having holes 32 aligned with contact pads 34 on the PCB in accordance with one embodiment of the invention. Positioned in holes 32 are helical springs 36 formed of a very thin, gold plated, high temperature spring wire. The springs have a diameter similar to but slightly smaller than the base of socket pins to insure contact with the socket pins, and holes 32 in holder plate 30 are slightly larger than the socket pins for reception of the pins in engagement with springs 36. The holder plate is made of electrically nonconducting material or can be coated with a nonconductive layer.

Figure 1:
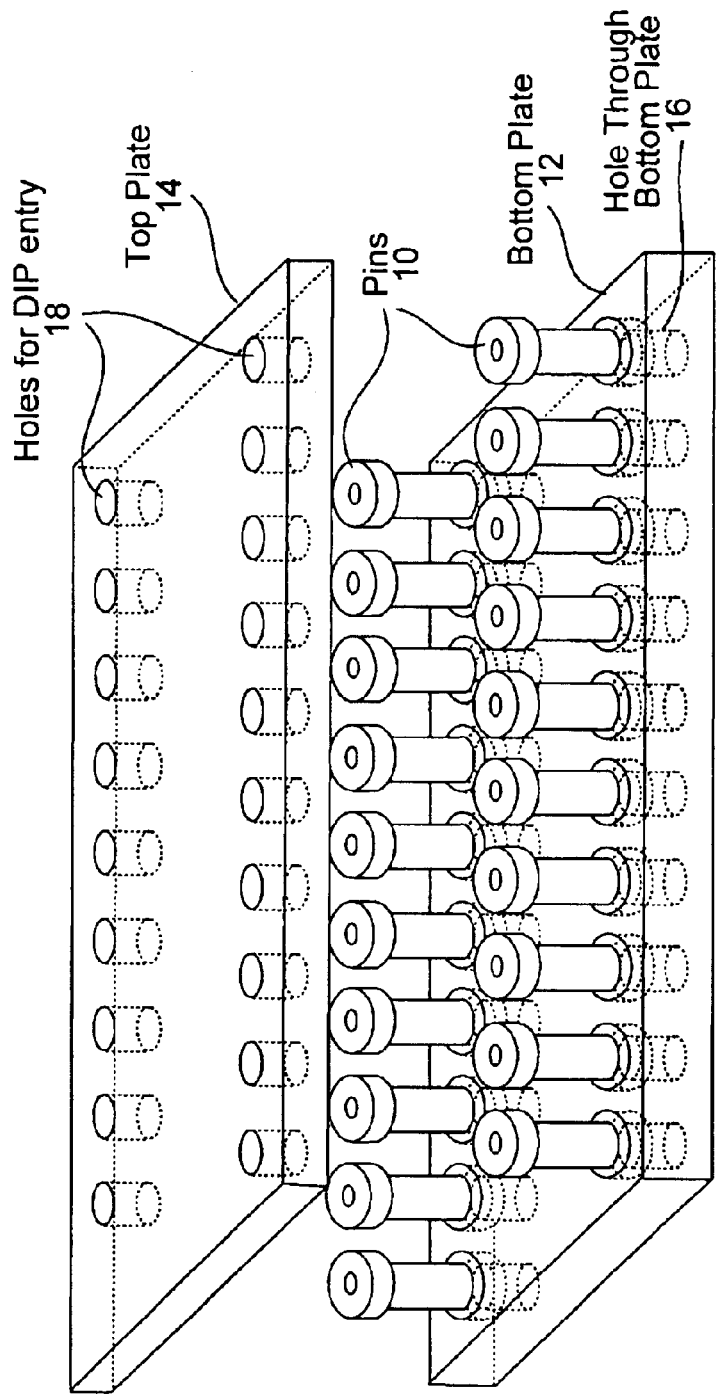
FIG. 1 is an exploded perspective view of a prior art test socket.
Figure 6:
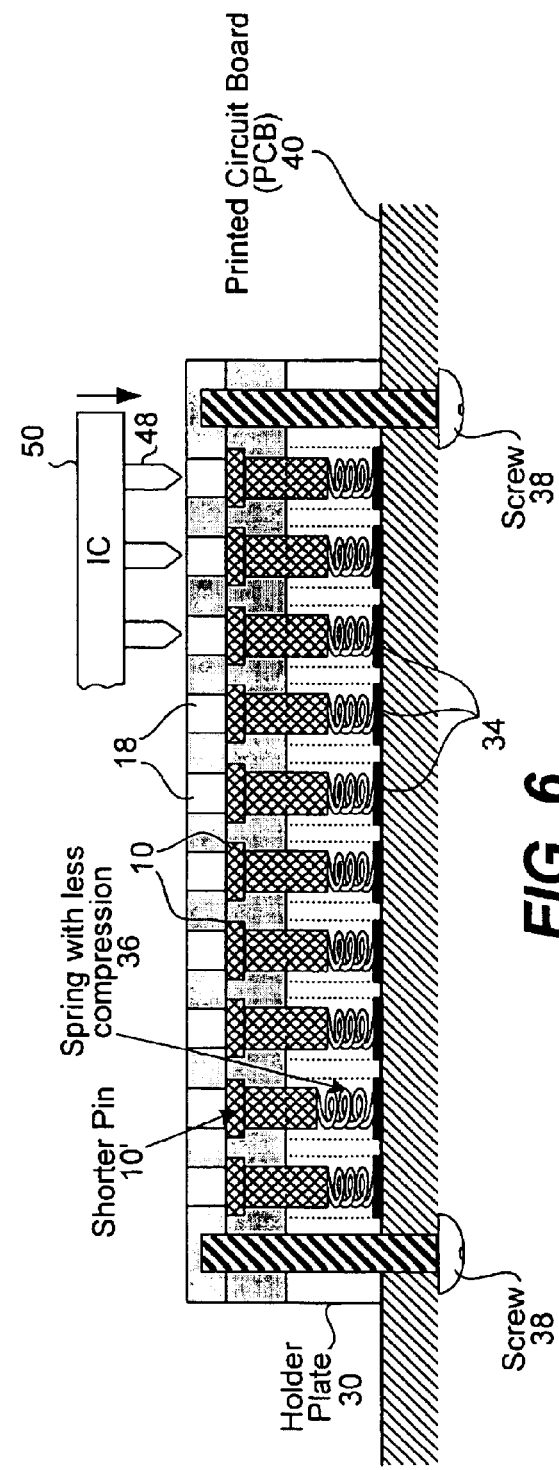
FIG. 6 is a side view in section of the holder plate and PCB of FIG. 5 with a test socket mounted thereon.

As shown in FIG. 6, socket assembly similar to that shown in FIGS. 1 and 2 is then mounted on holder plate 30 with screws 38 or other suitable fasteners extending through the top plate and bottom plate of the socket through holder plate 30 and into engagement with PCB 40. Leads 48 of integrated circuit 50 (only a portion is shown) are received in holes 18 of the socket assembly, and physically engage Pins 10 which are electrically connected to pads 34 through compressed springs 36. It will be appreciated that a shorter pin 10' has electrical contact with an underlying pad 34 on PGB 40 by means of a spring 36, albeit the spring will have less compression than other springs. The length of the springs is designed in such a way that the process of mounting the socket will compress the springs by an amount that is significantly larger than any reasonable variation in the length of the socket pins. This assures that the spring will still compress for the short pins, albeit the amount of compression for the springs under the shorter pins will be somewhat less than for the longer pins. Thus, the springs effectively serve as independent suspensions for the pins. Further, because the springs are placed in individual holes in the holder plate, the possibility of one spring laterally shorting to an adjacent spring is avoided. Additionally, if there are any defective springs in the assembly, the entire structure can be easily disassembled thereby facilitating repair.

The test socket using spring contacts between socket pins and circuit pads on a PCB overcomes problems in the prior art due to variable lengths of socket pins and shorting due to gold paste flow. The structure is readily disassembled for repair since a gold paste and the like is not employed.

While the invention has been described with reference to specific embodiments, the description is illustrative of the invention and is not to be construed as limiting the invention. Other embodiments may occur to those skilled in the art such as, for example, integrating the bottom plate of the socket and the holder plate. Accordingly, various modifications and applications may occur to those skilled in the art without departing from the true spirit and scope of the invention as defined by the appended claims.

What is claimed is:

1. A test socket assembly for use in testing integrated circuits comprising:
   a) a spring holder plate having a plurality of holes for receiving a plurality of electrically conducting springs,
   b) a plurality of helical electrically conductive and compressible springs in the plurality of holes, and
   c) a test socket including a plurality of pins for receiving leads of an integrated circuit, the pins extending into the plurality of holes in the spring holder plate with each pin engaging a spring, wherein the spring holder plate is positionable on a printed circuit board with the plurality of holes being in alignment with electrical contacts on the printed circuit board, the plurality of springs electrically interconnecting the contacts and the plurality of pins, whereby pins of varying length are electrically connected to the pads through the helical springs.

2. The test socket assembly as defined by claim 1 and further including fasteners for fastening the test socket assembly to a printed circuit board.

3. The test socket assembly as defined by claim 1 wherein the test socket comprises a bottom plate and a top plate, the bottom plate having a plurality of holes for receiving the plurality of pins, the top plate having a plurality of holes aligned with the plurality of holes in the bottom plate for receiving leads of an integrated circuit, the leads extending into the pins.

4. The test socket assembly as defined by claim 3 wherein the top portion of each pin is larger in diameter than the bottom portion, the plurality of holes in the bottom plate having countersunk portions for receiving the top portion of each pin.

5. A test assembly for use in testing integrated circuits comprising:
   a) a printed circuit board having a plurality of pads connectable to test equipment,
   b) a spring holder plate having a plurality of holes for receiving a plurality of helical electrically conductive springs, the plurality of holes being aligned with the plurality of pads on the printed circuit board,
   c) a plurality of compressed helical electrically conductive springs in the plurality of holes, and
   d) a test socket including a plurality of pins for receiving leads of an integrated circuit, the pins extending into the plurality of holes in the spring holder plate with the compressed helical springs electrically connecting the pins to the pads on the printed circuit board.

6. The test assembly as defined by claim 5 and further including fasteners for fastening the test socket and spring holder plate to the printed circuit board.

7. The test assembly as defined by claim 5 wherein the test socket comprises a bottom plate and a top plate, the bottom plate having a plurality of holes for receiving the plurality of pins, the top plate having a plurality of holes aligned with the plurality of holes in the bottom plate for receiving leads of an integrated circuit, the leads extending into the pins.

8. The test assembly as defined by claim 7 wherein the top portion of each pin is larger in diameter than the bottom portion, the plurality of holes in the bottom plate having countersunk portions for receiving the top portion of each pin.

\* \* \* \* \*